United States Patent

Francese et al.

(10) Patent No.: US 9,509,281 B1
(45) Date of Patent: Nov. 29, 2016

(54) PEAKING INDUCTOR ARRAY FOR PEAKING CONTROL UNIT OF TRANSCEIVER

(71) Applicant: International Business Machines Corporation, Armonk, NY (US)

(72) Inventors: Pier A. Francese, Adliswil (CH); Mangal Prasad, Poughkeepsie, NY (US); Hung H. Tran, Poughkeepsie, NY (US); Xiaobin Yuan, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/082,723

(22) Filed: Mar. 28, 2016

Related U.S. Application Data

(63) Continuation of application No. 14/816,435, filed on Aug. 3, 2015.

(51) Int. Cl.
*H03H 11/48* (2006.01)
(52) U.S. Cl.
CPC .................................. *H03H 11/48* (2013.01)
(58) Field of Classification Search
CPC ... H03H 11/48; H03H 11/485; H03H 11/486
USPC .................................................. 333/213–215
See application file for complete search history.

(56) References Cited

U.S. PATENT DOCUMENTS

| 6,028,496 | A | * | 2/2000 | Ko | H03H 11/50 330/85 |
| 6,104,230 | A | * | 8/2000 | Jarcy | H03H 11/48 327/427 |
| 6,737,944 | B2 | * | 5/2004 | Kunikiyo | H03H 11/48 333/214 |
| 6,985,036 | B2 | * | 1/2006 | Bhattacharjee | H03F 3/45183 330/253 |
| 7,265,623 | B2 | * | 9/2007 | Bhattacharjee | H03F 1/42 330/254 |
| 8,115,575 | B2 | * | 2/2012 | Hsu | H03H 11/08 333/214 |
| 8,335,249 | B1 | | 12/2012 | Su et al. | |
| 9,024,710 | B2 | * | 5/2015 | Kimura | H03H 11/48 333/213 |
| 9,288,085 | B2 | | 3/2016 | Bulzacchelli et al. | |
| 2010/0008414 | A1 | | 1/2010 | Lee et al. | |
| 2015/0312064 | A1 | | 10/2015 | Bulzacchelli et al. | |

OTHER PUBLICATIONS

List of IBM Patents or Patent Applications Treated as Related; (Appendix P) Filed Jul. 28, 2016, 2 pages.
Pier Andrea Francese, et al., "Peaking Inductor Array for Peaking Control Unit of Transceiver," U.S. Appl. No. 14/816,435, filed Aug. 3, 2015.

* cited by examiner

*Primary Examiner* — Robert Pascal
*Assistant Examiner* — Alan Wong
(74) *Attorney, Agent, or Firm* — Cantor Colburn LLP; Margaret McNamara

(57) ABSTRACT

Embodiments relate to peaking inductor array for a peaking control unit of a transceiver. An aspect includes the peaking inductor array comprising a plurality of cells connected in parallel, each cell comprising a respective active inductor. Another aspect includes each of the plurality of cells further comprising a decoupling capacitor.

1 Claim, 4 Drawing Sheets

… …

PEAKING INDUCTOR ARRAY FOR PEAKING CONTROL UNIT OF TRANSCEIVER

DOMESTIC PRIORITY

This application is a continuation of U.S. patent application Ser. No. 14/816,435, filed Aug. 3, 2015, the disclosure of which is incorporated by reference herein in its entirety.

BACKGROUND

The present invention relates to the field of equalization in high-speed receiving units, and more particularly to a peaking inductor array for a peaking control unit of a transceiver.

Data transceiving systems for high-speed communication are subject to signal distortion of the transmitted signal. Various measures are applied to reconstruct the transmitted data from the received analog signal. In receiving units, a number of equalizers are commonly provided to compensate for losses and signal distortion substantially caused by propagating the data signal via the transmission channel.

One known measure concerns an equalization of the received analog signal in the continuous time regime, i.e., before sampling and digitization and before the final digital processing of information is performed, by means of a continuous-time linear equalizer. The received analog signal to be processed by the continuous-time linear equalizer corresponds to a continuous voltage or current signal which is transmitted across the physical transmission channel according to a digital modulation format, e.g., to non-return-to-zero binary level signaling or to a pulse amplitude modulation with four signaling levels (PAM-4). It is the general purpose of a continuous-time linear equalization to compensate for the losses of high-frequency components of the transmitted analog signal which are caused by attenuation and dispersion of the signal propagating along the transmission channel.

SUMMARY

Embodiments relate to peaking inductor array for a peaking control unit of a transceiver. An aspect includes the peaking inductor array comprising a plurality of cells connected in parallel, each cell comprising a respective active inductor. Another aspect includes each of the plurality of cells further comprising a decoupling capacitor.

Further embodiments relate to a method for providing a peaking control unit of a transceiver. An aspect includes forming a peaking inductor array comprising a plurality of cells connected in parallel, each cell comprising a respective active inductor. Another aspect includes connecting a decoupling capacitor to each active inductor in each cell of the peaking inductor array.

Further embodiments relate to a peaking control unit of a transceiver. An aspect includes a peaking inductor array comprising a plurality of cells connected in parallel, each cell comprising a respective active inductor, wherein each of the plurality of cells further comprises a decoupling capacitor.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Embodiments of a peaking inductor array for a transceiver are provided, with exemplary embodiments being discussed below in detail. The two-dimensional peaking inductor array is included in a peaking control unit of a transceiver, which may comprise a continuous-time linear equalizer, and gives impedance peaking in both the frequency and amplitude dimensions. The peaking inductor array boosts the high frequency content of a received signal in a receiver circuit of the transceiver. The peaking inductor array is made up of active inductors, each including a plurality of field effect transistors (FETs). Active inductors, which are made of field effect transistors (FETs) and are used in many transceiver circuits, are relatively small area, low power, tunable devices that allow frequency selection and filtering. The active inductors of the peaking inductor array include, in various embodiments, a decoupling capacitor and/or a selectable resistor. The decoupling capacitor reduces sensitivity of the peaking inductor array to the intrinsic and extrinsic capacitances of FETs of the active inductors. The selectable resistor is used to enable voltage peaking in two dimensions, i.e., frequency and amplitude, in order to reduce sensitivity of the peaking inductor array to variations in frequency between the FETs of the active inductors. The decoupling capacitor and/or selectable resistor thereby provide good peaking response in the peaking inductor array.

A decoupling capacitor having a relatively high capacitance value may be added to each active inductor cell of the peaking inductor array. Process variation in the formation of the FETs of the active inductors may also cause variation in the intrinsic and extrinsic capacitances between FETs, which may reduce sensitivity of the active inductors and degrade peaking performance. Therefore, a relatively large decoupling capacitor, as compared to the gate/source capacitance (Cgs) and the gate/drain capacitance (Cgd) of a FET of the active inductor cell, is added to each active inductor cell in decouple the Cgs from the Cgd, thereby reducing sensitivity to process variation in the active inductor array, improving peaking performance, and providing good peaking control.

The selectable resistor, which may comprise a resistor in series with a switch in various embodiments, may be used to change the location in the frequency and/or amplitude domain of the peak gain of an active inductor of the peaking inductor array. The selectable resistor therefore also enables good peaking control and may be used to offset process variation in the formation of the FETs of the active inductors during operation of the peaking inductor array.

Figure 1:
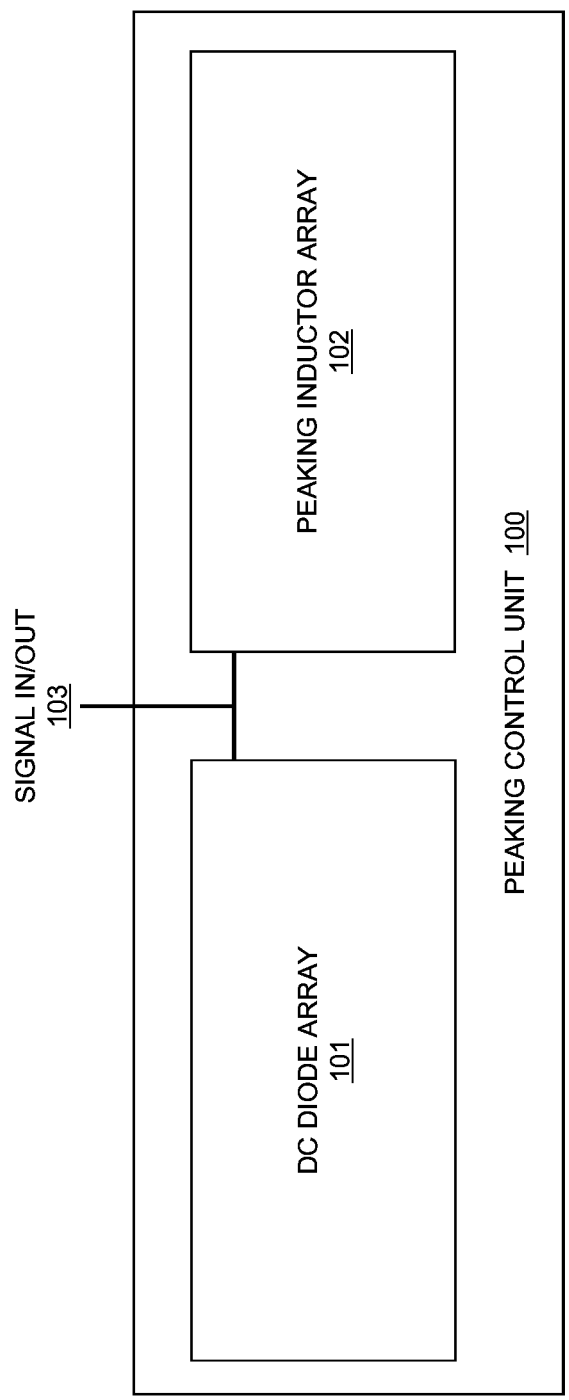
FIG. 1 depicts a peaking control unit of a transceiver in accordance with an embodiment.

FIG. 1 illustrates an embodiment of a peaking control unit 100. The peaking control unit 100 may be part of a transceiver comprising a continuous-time linear equalizer in some embodiments, and includes a signal input/output 103. An example of a continuous-time linear equalizer for use in a receiving unit of a high-speed data transmission system is disclosed in U.S. application Ser. No. 14/669,225 (Bulzacchelli et al.), filed on Mar. 26, 2015, which is herein incorporated by reference in its entirety. The signal input/output 103 of the peaking control unit 100 receives an input current corresponding to a signal that is received by the transceiver. An output voltage corresponding to amplified high-frequency portions of the received signal is produced at signal input/output 103 based on the impedance of the peaking control unit 100, i.e., Vout=Iin*Z, where Iin is the input current, Vout is the output voltage, and Z is the impedance of the peaking control unit 100. The peaking control unit comprises a DC diode array 101 and a peaking inductor array 102. The DC diode array 101 is discussed in further detail below with respect to FIG. 2A. The peaking inductor array 102 is discussed in further detail below with respect to FIG. 2B.

Figure 2A:
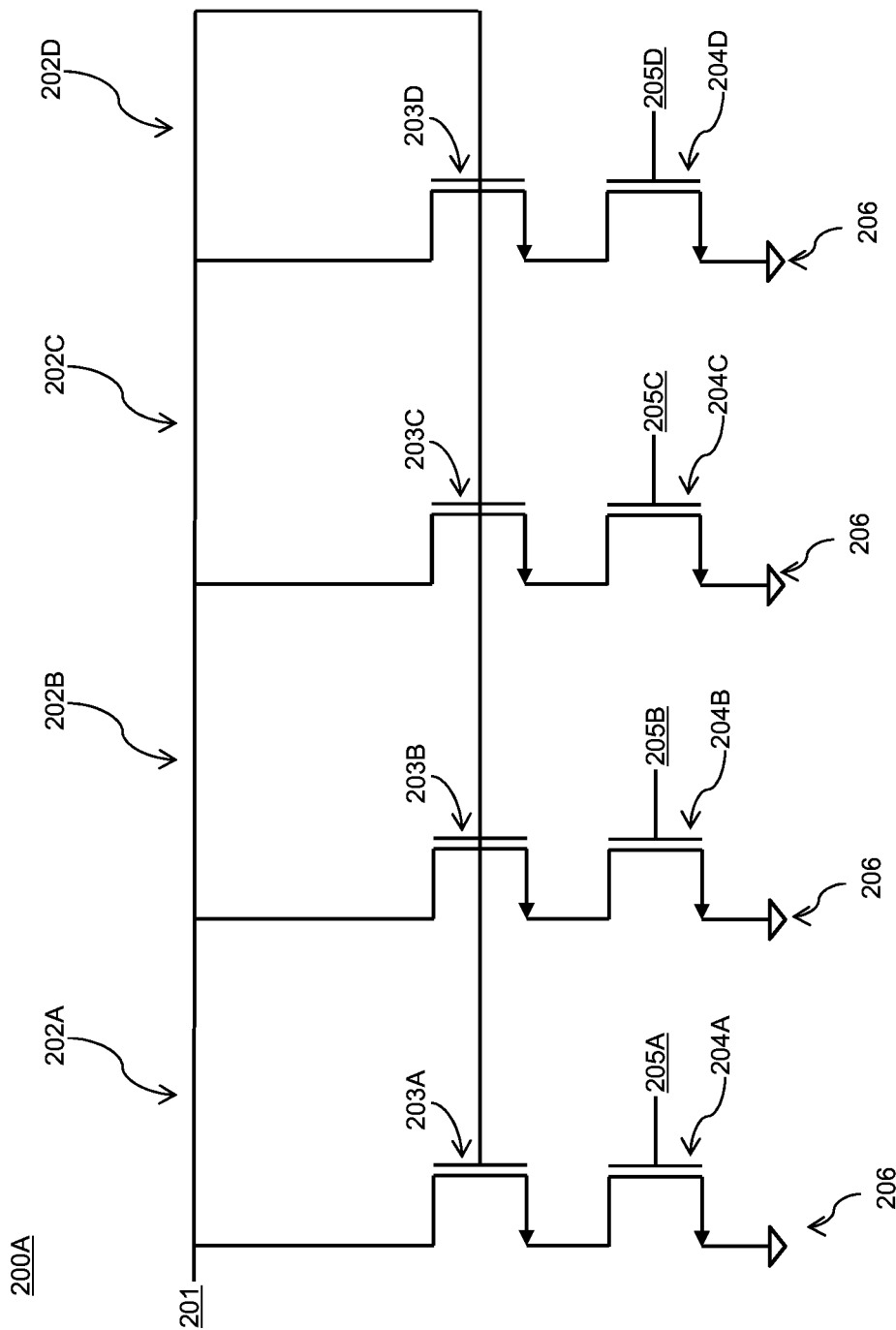
FIG. 2A depicts a direct current (DC) diode array of the peaking control unit in accordance with an embodiment.

FIG. 2A illustrates an embodiment of a DC diode array 200A, which may comprise embodiments of DC diode array 101 of FIG. 1. As shown in FIG. 2A, DC diode array 200A includes 4 cells 202A-D; however, this is for illustrative purposes only, a DC diode array may include any appropriate number of cells in various embodiments. Input/output terminal 201 is connected to signal input/output 103 of FIG. 1. The input current from input/output terminal 201 is received by each cell 202A-D of the DC diode array 200A, and an output voltage that is produced based on the input current and the impedance of the DC diode array 101/200A and the peaking inductor array 102/200B is provided at the input/output terminal 201 to signal input/output 103. Cells 202A-D are connected in parallel in between the input/output terminal 201 and ground 206. Each of cells 202A-D includes a first field effect transistor (FET) 203A-D connected in series with a second FET 204A-D. The gate of the first FET 203A-D in each cell 202A-D is connected to the input/output terminal 201. Each second FET 204A-D in each cell 202A-D acts as an on/off switch for the respective cell 202A-D, and is controlled by a second FET gate voltage terminal 205A-D. The gate voltages provided at the second FET gate voltage terminals 205A-D may be complementary voltages of gate voltages provided at corresponding second FET gate voltage terminals 215A-D in the peaking inductor array 102/200B, shown in FIG. 2B.

Figure 2B:
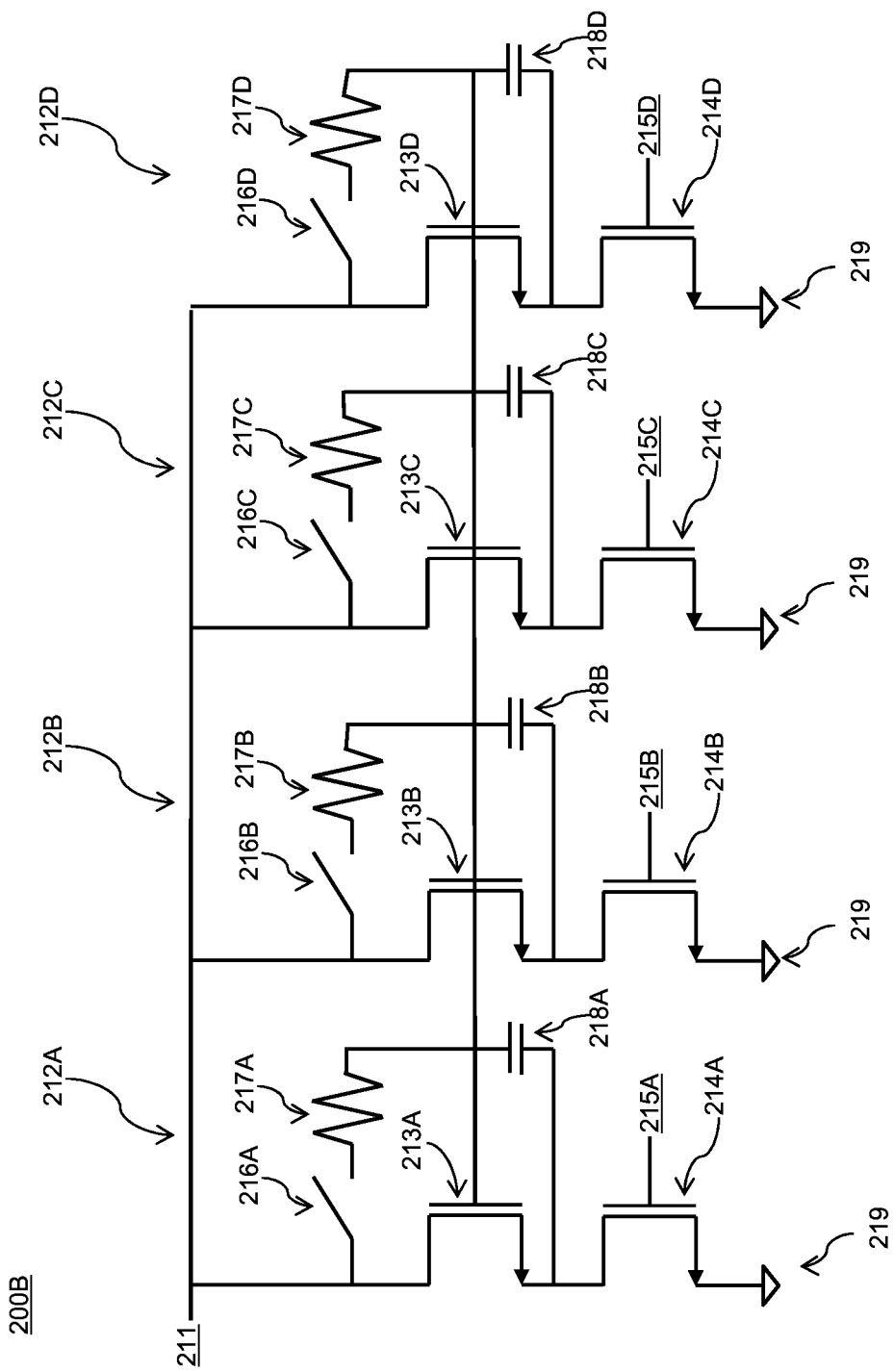
FIG. 2B depicts a peaking inductor array of the peaking control unit in accordance with an embodiment.

FIG. 2B illustrates an embodiment of a peaking inductor array 200B, which may comprise embodiments of peaking inductor array 102 of FIG. 1. As shown in FIG. 2B, peaking inductor array 200B includes 4 cells 212A-D; however, this is for illustrative purposes only, a peaking inductor array may include any appropriate number of cells in various embodiments. The cells 212A-D, each comprising an active inductor, are connected in parallel between an input/output terminal 211 and ground 219. The input current from input/output terminal 211 is received by each cell 212A-D of the peaking inductor array 200B, and an output voltage that is produced based on the input current and the impedance of the DC diode array 101/200A and the peaking inductor array 102/200B is provided at the input/output terminal 211 to signal input/output 103. Each of cells 212A-D includes a first FET 213A-D connected in series with a second FET 214A-D. The source of the first FET 213A-D in each cell is connected to the signal input/output 102. The gate of the first FET 213A-D in each cell 212A-D is connected to the input/output terminal 211 via a selectable resistor comprising a switch 216A-D and a resistor 217A-D, which is discussed below. Each second FET 214A-D in each cell 212A-D acts as an on/off switch for the respective cell 212A-D, and is controlled by a second FET gate voltage terminal 215A-D. The gate voltages provided at the second FET gate voltage terminals 215A-D may be complementary voltages of gate voltages provided at corresponding second FET gate voltage terminals 205A-D in the DC diode array 101/200A, as shown in FIG. 2A.

Each cell 212A-D of the peaking inductor array 200B further includes a selectable resistor, comprising a switch 216A-D in series with a resistor 217A-D, further in series with a decoupling capacitor 218A-D. The selectable resistor (216A-D, 217A-D) and decoupling capacitor (218A-D) are connected in parallel with the first FET 213A-D in each cell 212A-D. The decoupling capacitor 218A-D acts to decouple the intrinsic and extrinsic capacitances of the FETs 213A-D/215A-D. Further, because the amount of additional capacitance in each cell (i.e., decoupling capacitors 218A-D) is controlled, variation in intrinsic and extrinsic capacitances between the cells 212A-D is reduced. Changing the resistance value in the cells 212A-D of the peaking inductor array 200B by opening and closing the switch 216A-D allows movement of the peak gain of the peak inductor array 200B in two dimensions, i.e., frequency and amplitude. In some embodiments, each of resistors 217A-D may have the same resistance value; in other embodiments the resistors 217A-D may have different resistance values. In some embodiments, each of decoupling capacitors 218A-D may have the same capacitance value; in other embodiments the decoupling capacitors 218A-D may have different capacitance values. In some embodiments of a peaking inductor array 200B, the decoupling capacitors may be omitted; in other embodiments, the selectable resistors may be omitted.

Figure 3:
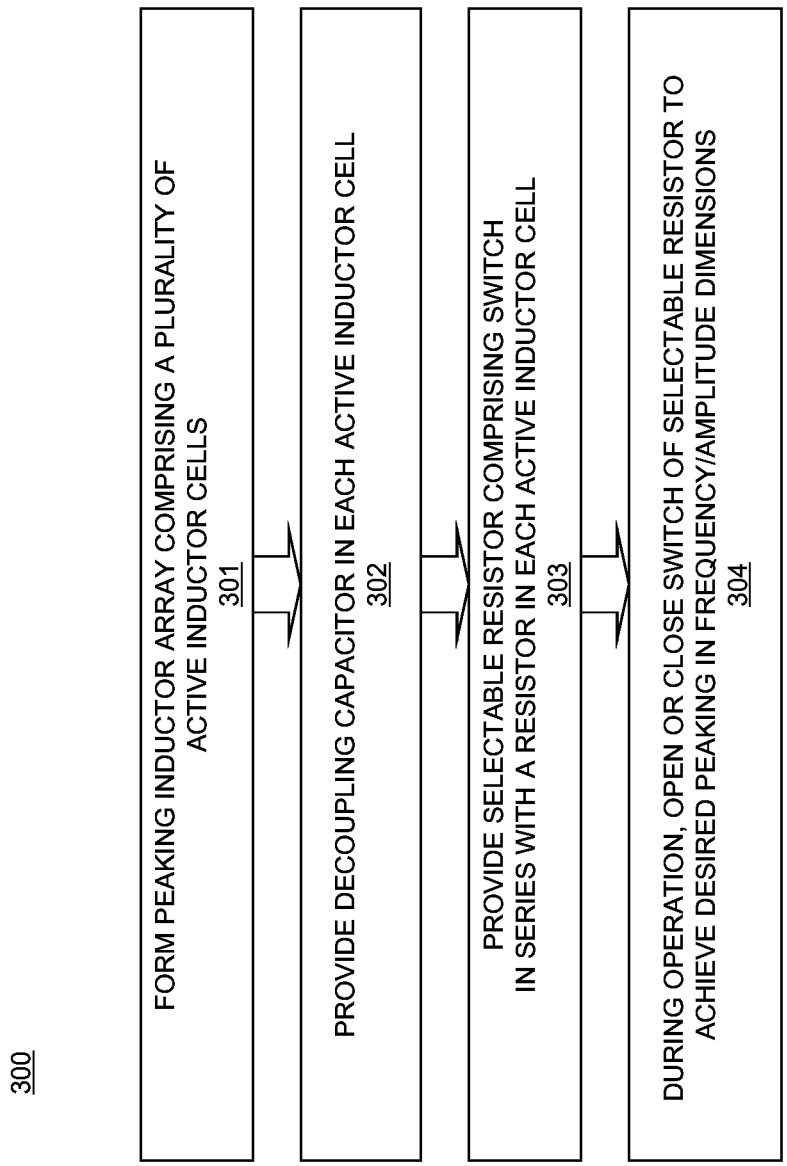
FIG. 3 depicts a process flow for a peaking inductor array of a peaking control unit of a transceiver in accordance with an embodiment.

FIG. 3 illustrates an embodiment of a method 300 for a peaking inductor array of a peaking control unit of a transceiver. In block 301, a peaking inductor array, comprising plurality of active inductor cells, is formed for a peaking control unit. The peaking inductor array that is formed in block 301 may comprise, in various embodiments, the peaking inductor array 200B shown in FIG. 2B, including cells 212 A-D that each comprise active inductors including a first FET 213A-D and a second FET 214A-D. In block 302, a decoupling capacitor, such as decoupling capacitors 218A-D, is provided in each cell. Each decoupling capacitor decouples the Cgs from the Cgd of the FETs of the active inductor, thereby improving peaking performance of the peaking inductor array, and has a larger capacitance than the intrinsic and extrinsic capacitances of the active inductor of the cell in which the decoupling capacitor is located. In some embodiments, each of the decoupling capacitors that are provided in block 302 may have the same capacitance value; in other embodiments the decoupling capacitors may have different capacitance values. In block 303, a selectable resistor, such as the selectable resistor comprising switches 216A-D in series with resistors 217A-D in each of cells 212A-D, is provided in each cell. The selectable resistor allows impedance peaking to be performed by the peaking inductor array in two dimensions, i.e., frequency and amplitude. In some embodiments, each of the selectable resistors may have the same resistance value; in other embodiments the selectable resistors may have different resistance values. In block 304, during operation of the peaking inductor array, such as peaking inductor array 102/200B in a peaking control unit 100 in a receiver circuit, the switches of the selectable resistors may be opened or closed to increase or decrease the resistance of the cells during operation, so as to control the peaking of the peaking inductor array.

Technical effects and benefits include a peaking inductor array that allows relatively fine peaking control, with reduced sensitivity to process variation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A peaking inductor array, the peaking inductor array comprising:
 a plurality of cells connected in parallel, wherein each cell comprises a respective active inductor, a respective decoupling capacitor, and a respective selectable resistor,
 wherein each respective active inductor comprises a respective first field effect transistor (FET) in series with a respective second FET, wherein the respective decoupling capacitor and the respective selectable resistor in each cell are connected in series and are each connected in parallel with the respective first FET, and wherein a capacitance of the respective decoupling capacitor in each cell is larger than intrinsic and extrinsic capacitances of the respective active inductor,
 wherein each respective selectable resistor comprises a respective switch in series with a respective resistor, wherein each respective switch is opened or closed to control peaking of the peaking inductor array in two dimensions,
 wherein the peaking inductor array is located in a peaking control unit of a transceiver circuit, and
 wherein the peaking inductor array is connected in parallel with a direct current (DC) diode array in the peaking control unit.

* * * * *